US012563889B2

(12) United States Patent
Lee et al.

(10) Patent No.: US 12,563,889 B2
(45) Date of Patent: Feb. 24, 2026

(54) DISPLAY APPARATUS COMPRISING ANTISTATIC MEMBER FOR REDUCING BRIGHTENING AND GREENISH PHENOMENON

(71) Applicant: LG DISPLAY CO., LTD., Seoul (KR)

(72) Inventors: Kwangju Lee, Paju-si (KR); Wangeon Sim, Paju-si (KR); Kyounghoon Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 629 days.

(21) Appl. No.: 17/993,058

(22) Filed: Nov. 23, 2022

(65) Prior Publication Data

US 2023/0180507 A1    Jun. 8, 2023

(30) Foreign Application Priority Data

Dec. 6, 2021    (KR) ......................... 10-2021-0172547

(51) Int. Cl.
*H10K 50/84*        (2023.01)
*H10D 89/60*        (2025.01)
*H10K 50/87*        (2023.01)

(52) U.S. Cl.
CPC ............. *H10K 50/84* (2023.02); *H10D 89/60* (2025.01); *H10K 50/87* (2023.02)

(58) Field of Classification Search
None
See application file for complete search history.

(56) References Cited

U.S. PATENT DOCUMENTS

2023/0062254 A1*   3/2023   Jang ...................... H10K 77/111

FOREIGN PATENT DOCUMENTS

| | | |
|---|---|---|
| CN | 113112927 A | 7/2021 |
| CN | 115731813 A | 3/2023 |
| GB | 2571596 A | 9/2019 |
| KR | 10-2017-0003812 A | 1/2017 |
| KR | 10-2020-0073086 A | 6/2020 |
| KR | 10-2021-0081953 A | 7/2021 |
| WO | WO2018/193953 A1 | 10/2018 |

* cited by examiner

*Primary Examiner* — Daniel Whalen
(74) *Attorney, Agent, or Firm* — Birch, Stewart, Kolasch & Birch, LLP

(57) ABSTRACT

A display apparatus includes a display panel; a protective cover member disposed on the display panel; a first plate disposed below the display panel; a cushion plate disposed below the first plate; a connection path formed below the first plate and spaced a predetermined distance from the cushion plate to form a groove portion between the connection path and the cushion plate; and an antistatic member disposed on a rear surface of the cover member, extending on sides of the display panel and the first plate, and extending on a side and a bottom of the connection path to the groove portion and configured to transfer electrostatic charges from the cover member to the cushion plate.

20 Claims, 10 Drawing Sheets

Fig. 5C

DISPLAY APPARATUS COMPRISING ANTISTATIC MEMBER FOR REDUCING BRIGHTENING AND GREENISH PHENOMENON

CROSS REFERENCE TO A RELATED APPLICATION

The present application claims priority to Republic of Korea Patent Application No. 10-2021-0172547, filed on Dec. 6, 2021, the entire contents of which are incorporated by reference into the present application.

BACKGROUND OF THE DISCLOSURE

Field of the Disclosure

The present disclosure relates to a display apparatus for reducing a brightening phenomenon in which edges of a display panel are brighter than other areas of the display panel, and also a greenish phenomenon in which edges of the display panel are greener in color than the other areas of the display panel.

Description of the Related Art

Display apparatuses include televisions, monitors, smartphones, tablet PCs, laptops, etc. In addition, a liquid crystal display (LCD) apparatus and an organic light emitting display (OLED) apparatus are currently being used as display apparatuses. Further, the LCD apparatus includes a display panel with liquid crystals to implement images, and the OLED apparatus includes a display panel with self-light emitting elements. Thus, the LCD apparatus requires a backlight unit that emits light from a rear surface. However, the backlight unit increases a thickness of the LCD apparatus, and restricts the types of display designs.

On the contrary, the OLED apparatus includes the self-light emitting elements and thus can be made thinner than the LCD apparatus. The OLED apparatus can also be provided as a bendable display. In addition, the self-light emitting elements of the OLED apparatus are driven by applying a voltage or current to a circuit including transistors, capacitors and the like. Thus, the OLED apparatus may operate abnormally if outside electric charges are introduced to the display panel.

Further, the display apparatus generally includes a protective cover member made of glass or plastic to protect the display panel from external shocks. However, electrostatic charges are often formed and accumulate on the cover member because of friction between the cover member and a user, for example. Therefore, a strong electric field can be generated in response to the accumulated electrostatic charges. For example, the electrostatic charges accumulate at an end or in side areas of the display panel and generate a corresponding strong electric field on the sides of the display panel. The generated electric field however can shift a threshold voltage of the driving thin film transistors arranged on the sides of the display panel.

When the threshold voltage of the driving thin film transistors is shifted higher, the display panel will emit light using a higher voltage, which causes the brightening and greenish phenomenon. In addition, if the threshold voltage of driving thin film transistors disposed in the side areas of the display panel is shifted lower, the display panel will emit light using a signal lower than a light emitting signal. This lower signal causes the end or the side area of the display panel to emit light even though the light emitting signal is not applied. Thus, the end or the side area emits light while the other areas do not.

SUMMARY

Accordingly, an object of the present disclosure is to address the above-noted and other problems.

Another object of the present disclosure is to provide a novel display apparatus that reduces the brightening and greenish phenomenon.

To achieve these and other advantages and in accordance with the purpose of the present invention, as embodied and broadly described herein, the present invention provides in one aspect a display apparatus including a display panel displaying an image; a cover member disposed on the display panel and protecting the display panel from external shocks; a cushion plate disposed below the display panel and including a cushion layer and a heat dissipation layer; and an antistatic member extending and disposed from the cover member to the cushion plate. Further, the cushion plate includes a groove portion and a connection path on which the antistatic member is disposed.

The display apparatus further includes a first connecting member connecting the display panel and the cover member, and the antistatic member is sequentially disposed on a rear surface of the cover member, a side of the first connecting member, a side of the display panel, a side of the cushion plate and a rear surface of the cushion plate.

According to a display apparatus of one embodiment of the present disclosure, the antistatic member extends from a cover member to a display panel and then to a groove portion of a cushion plate, and an electric charge or electric field accumulated in the cover member and the display panel can be distributed to the cushion plate, thereby reducing a brightening phenomenon emitting light brighter at an end or a greenish phenomenon. In addition, a defect occurring when the antistatic member penetrates into other part can be prevented by forming the groove portion and connection path in the cushion plate.

Further scope of applicability of the present invention will become apparent from the detailed description given hereinafter. However, the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by illustration only, and thus are not limitative of the present invention, and wherein:

FIG. 5C is an enlarged perspective view illustrating a connection path according to another embodiment of the present disclosure.

DETAILED DESCRIPTION OF THE EMBODIMENTS

Figure 1A:
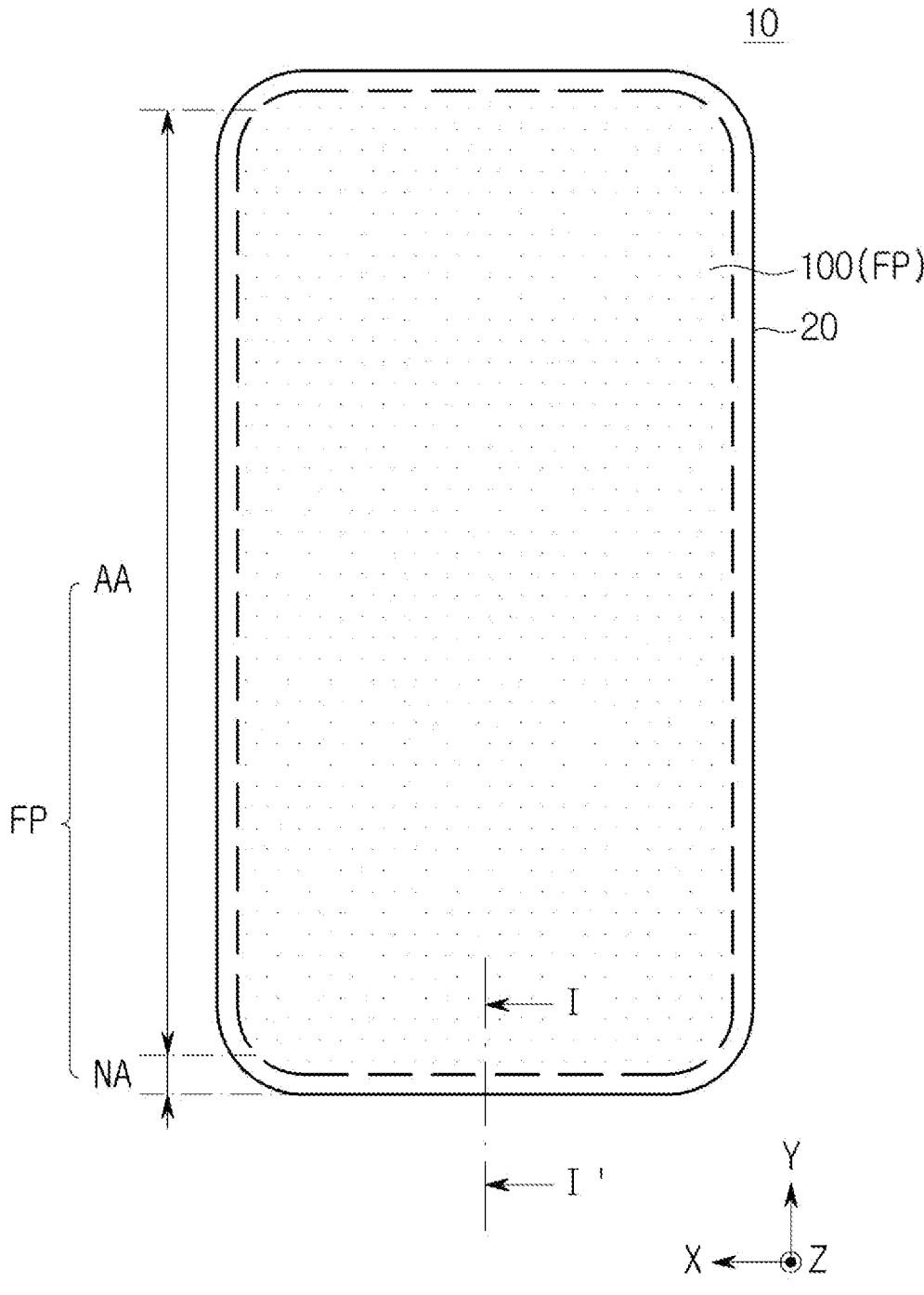
FIG. 1A is a plan view illustrating a front surface of a display apparatus according to an embodiment of the present disclosure.

Details to demonstrate the present disclosure will be more clearly understood from the following detailed description with accompanying drawings. However, the present disclosure is not limited to the embodiments disclosed hereinafter and can be implemented in various different forms. These embodiments are provided so that the present disclosure can be thorough and complete, and can fully convey the scope of the present disclosure to a person skilled in the art, and the claims are not limited by embodiments of the present disclosure.

The present disclosure is not limited to the accompanying drawings because shapes, sizes, ratio, angles, counts and the like presented in the drawings are examples to describe the embodiments. Like reference numerals denote like elements throughout the disclosure. Components are interpreted to include an error range unless otherwise expressly stated. In case of describing positions, for example, when describing position relation between two parts with terms such as 'in', 'upon', 'below', 'next' and the like, one or more intervening parts may be disposed between the two parts, unless the terms are used with terms 'immediately' or 'directly'. When an element or layer is disposed 'on' the other element or layer, another element or layer may be disposed directly on the other element or layer or therebetween.

Though terms such as 'a first', or 'a second' are used to describe various components, these components are not confined by these terms. These terms are merely used to distinguish one component from the other component. Therefore, a first component being mentioned in the description below may be a second component in a technical concept of the present disclosure.

Like reference numerals denote like elements throughout the disclosure. Sizes and thicknesses in the accompanying drawings are chosen for convenience of describing the specification; thus, the present disclosure is not limited by the illustrated sizes and thicknesses of the drawings.

The features of various aspects of the present disclosure can be partially or entirely connected or combined with each other and can be interlocked and operated in technically various ways as will be fully understood by those skilled in the art, and the embodiments can be carried out independently of or in association with each other. The display apparatus of the present disclosure may be applied to an organic light emitting display apparatus, but is not limited thereto, and may be applied to various display apparatuses such as LED display apparatus or a quantum dot display apparatus.

Hereinafter, a display apparatus according to embodiments of the present disclosure will be described in detail with reference to accompanying drawings. In particular, FIGS. 1A and 1B are plan views illustrating a front and a rear surface of a display apparatus 10, respectively, according to an embodiment of the present disclosure.

Figure 1B:
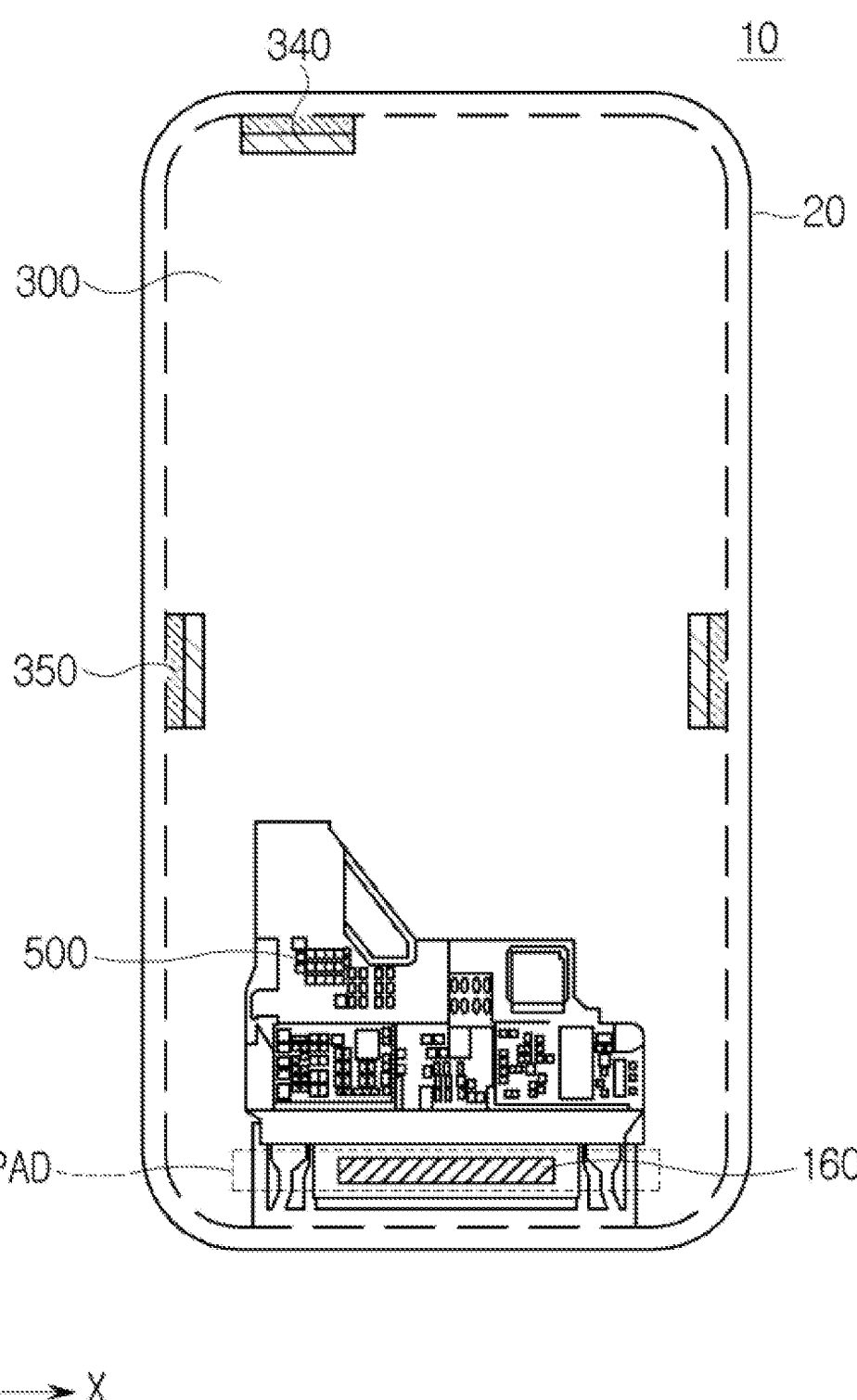
FIG. 1B is a plan view illustrating a rear surface of a display apparatus according to an embodiment of the present disclosure.

In particular, FIG. 1A illustrates the front surface of the display apparatus 10 including a protective cover member 20, a display panel 100 including a front part (FP) and an active area (AA), and FIG. 1B illustrates the rear surface of the display apparatus 10 including a cushion plate 300, a pad part (PAD), a driver 160 and a flexible printed circuit board 500.

In addition, the display panel 100 is attached below (−Z direction) the cover member 20, and the cushion plate 300 is disposed below the front part (FP) of the display panel 100. In more detail, the cover member 20 covers and protects the front surface of the display panel 100 from external shocks. The cover member 20 can be formed of a cover glass, a tempered glass, a reinforced plastic and the like, but is not limited thereto. Edges of the cover member 20 can also have a curved surface curved in a rear direction (−Z direction) of the display apparatus 10.

Further, the cover member 20 can be disposed to also cover and protect side areas of the display panel 100 from external shocks. The cover member 20 can be formed of a transparent material to overlap with an area displaying images. For example, the cover member 20 can be formed of a transparent plastic or a cover transparent glass that can transmit images.

In addition, a front part (FP) of the display panel 100 includes a pixel array unit having a plurality of light emitting elements, pixels having a driving thin film transistor and signal wiring for transmitting a driving signal. As shown in FIG. 1A, the front part (FP) includes an active area (AA) where images are displayed and a non-active area (NA) formed at edges encompassing the active area (AA). The cover member 20 also includes a corresponding active area (AA) and non-active area (NA). The non-active area (NA) encompassing the active area (AA) can be a bezel area, for example.

In addition, in one embodiment, the display panel 100 can include curved edges bending from a side of the front part (FP). As shown in FIG. 1B, the display panel 100 can also include a flexible printed circuit board 500, a driver 160 to drive pixels, and a pad part (PAD).

As shown in FIG. 1B, the cushion plate includes a groove portion 340 and a connection path 350 formed in a cushion plate 300. In more detail, the groove portion 340 and the connection path 350 can be formed by removing some portion among one or more layers forming the cushion plate 300. The connection path 350 can then be advantageously used to guide an antistatic solution later cured to form an antistatic member 700 (FIG. 1C) to prevent penetration of the antistatic solution into other areas. The groove portion 340 also advantageously receives excess antistatic fluid such that the antistatic member 700 can be efficiently formed.

That is, if the antistatic solution is formed in areas other than the edge region of the cushion plate 300, a resistance of a ground tape attached to the cushion plate 300 can increase resulting in decrease of a discharge function. Further, the antistatic solution may smear on a surface of the cushion plate 300 thereby reducing the appearance quality.

Figure 1C:
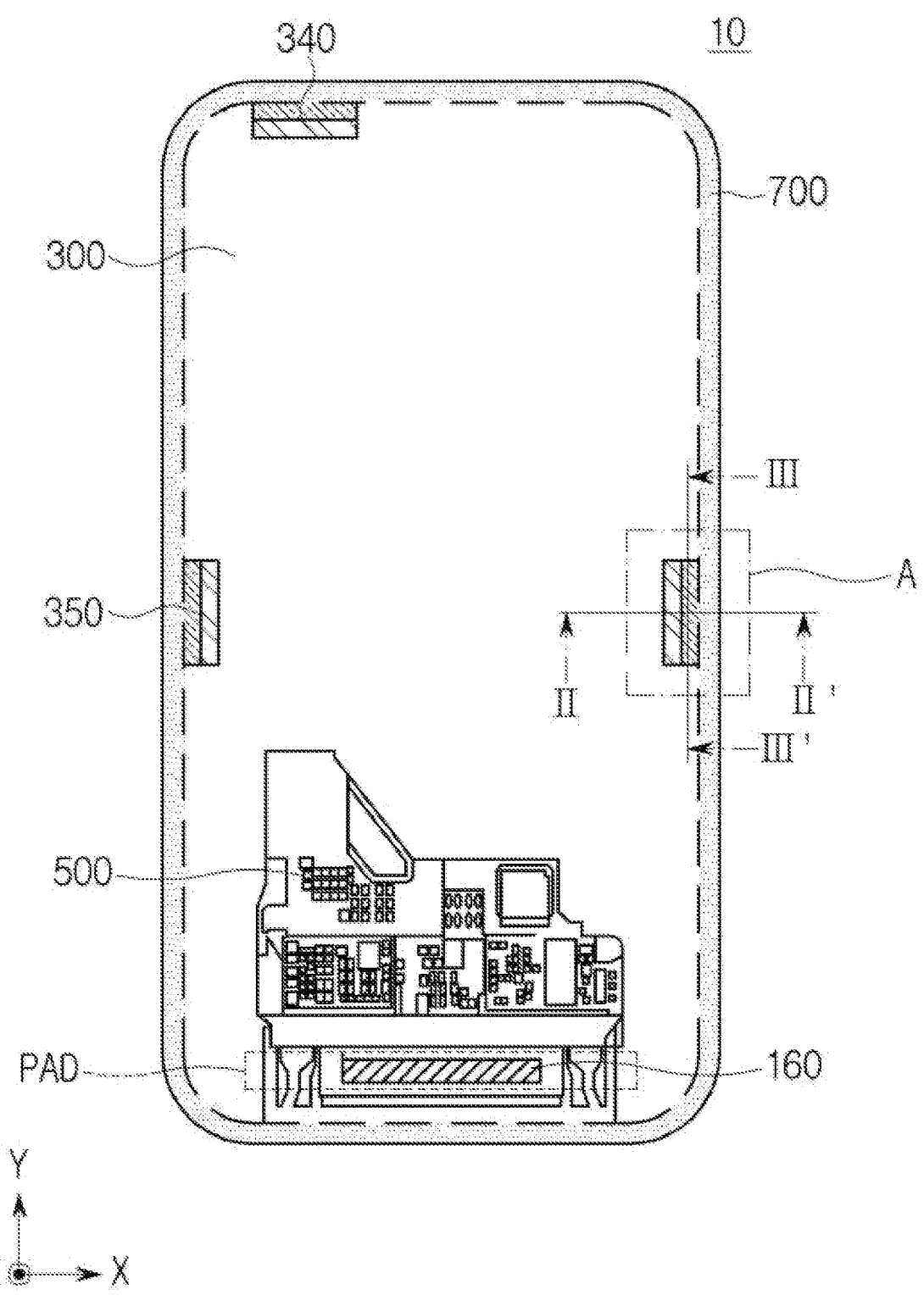
FIG. 1C is a plan view illustrating a rear surface including an antistatic member according to an embodiment of the present disclosure.

Next, FIG. 1C is a plan view illustrating the rear surface of the display apparatus 10 with the antistatic member 700 according to an embodiment of the present disclosure. In particular, FIG. 1C is similar to FIG. 1B, but further illustrates the antistatic member 700 disposed in edge regions of the rear surface of the cover member 20 and the cushion plate 300 (see also FIG. 3).

In one embodiment, the antistatic member 700 is formed on three sides of the display apparatus (i.e., the upper, left and right sides). That is, the antistatic member 700 can be formed in the edge region in the upper, left, and right sides of the cover member 20 and the cushion plate 300 but can be omitted in a lower end where the pad part (PAD) is positioned.

In more detail, electrostatic charges are generated on the four sides of the display panel 100 during an initial cutting process for trimming or cutting the display panel 100. The cover member 20 also generates electrostatic charges due to its inherent property, and the electrostatic charges from the cutting process are combined with the electrostatic charges from the cover member. These accumulated electrostatic charges cause the greenish phenomenon at edges of the display panel 100. However, because a driving thin film transistor is not formed in the pad part (PAD), the antistatic member 700 can be omitted in the lower portion of the display panel 100.

In addition, the antistatic member 700 can be formed by coating the end of the cushion plate 300 or the first plate 210 with an antistatic solution through a dispenser. In more detail, the antistatic solution can be coated in a dotting manner, by applying the antistatic solution with a regular spacing along the edges of the upper, left and right sides. However, as described above, the antistatic member 700 can be omitted at the lower side where the pad part (PAD) is positioned. In addition, application of the antistatic solution at corners of the display apparatus 10 can be omitted. The applied antistatic solution can also be left to naturally dry to form the antistatic member 700.

Also, to control the flow of the antistatic solution, a sufficient amount the antistatic solution is preferably applied with any excess antistatic solution flowing into the groove portion 340 through the connection path 350. Thus, the antistatic member 700 can be efficiently formed in the connection path 350 and the groove portion 340. In addition, the antistatic member 700 disposed in the connection path 350 can electrically connect the cover member 20 to the heat dissipation layer 310. In other words, the antistatic member 700 is connected to the cover member 20 via the connection path 350.

In addition, if the amount of the antistatic solution supplied is moderate or insufficient, excess solution will not flow into the groove portion 340. Then, in this instance, the antistatic member 700 is not formed in the groove portion 340.

Further, the electrostatic charge or electric field formed in the cover member 20 is transferred along the antistatic member 700 to the heat dissipation layer 310 of the cushion plate 300. Also, if the antistatic member 700 is electrically connected with a ground through a ground path, the electric charge of the cover member 20 can be discharged to the outside through the ground.

Figure 2:
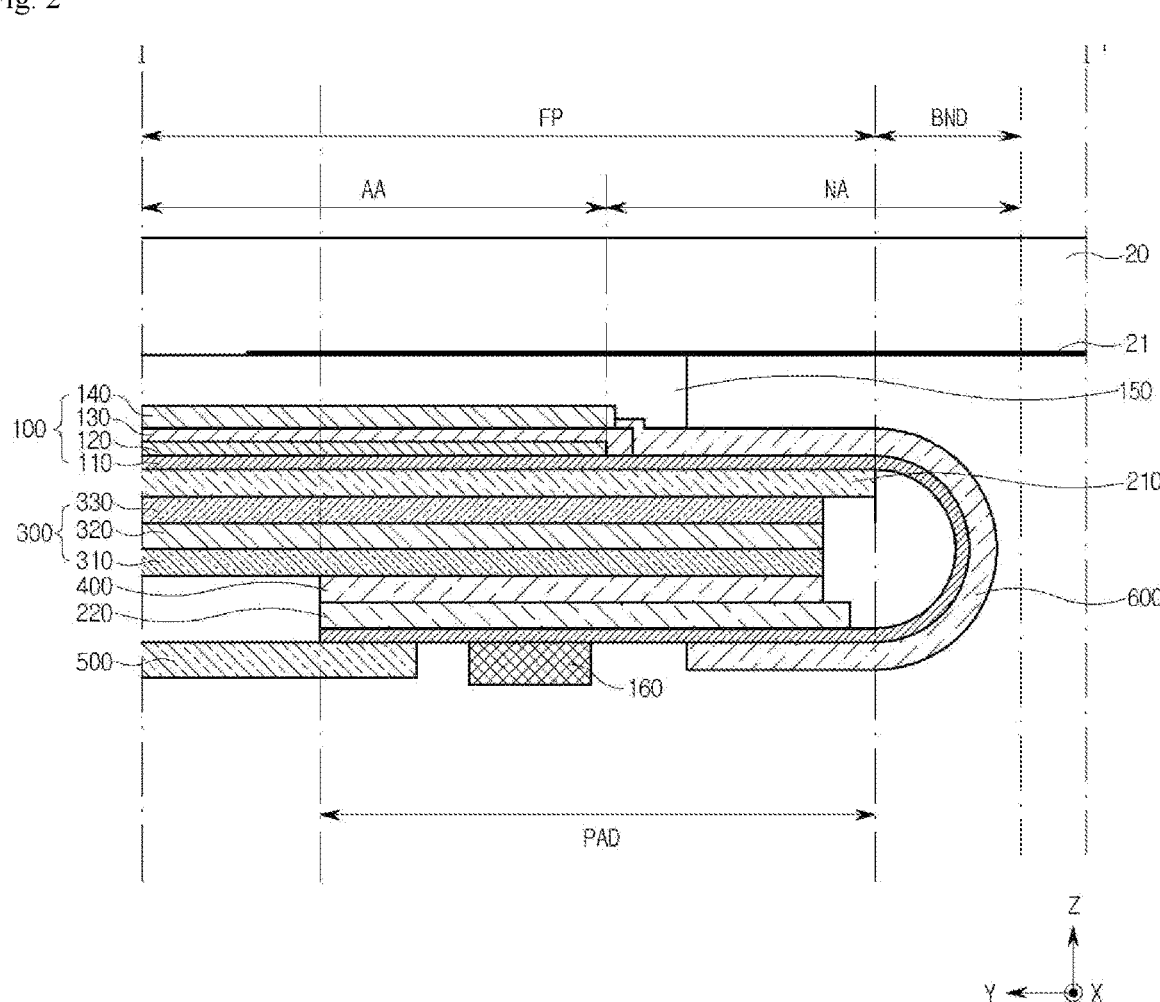
FIG. 2 is a sectional view taken along line I-I' of FIG. 1A.

Next, FIG. 2 is a sectional view taken along line I-I' of FIG. 1A. Referring to the FIG. 2, the display panel 100 is disposed under the cover member 20 and a first connecting member 150 is disposed between and couples the cover member 20 and the display panel 100. In addition, because the first connecting member 150 overlaps the active area (AA), the first connecting member 150 is made with a material that can transmit images. For example, the first connecting member 150 can be formed of an Optical Clear Adhesive (OCA), an Optical Clear Resin (OCR), a Pressure Sensitive Adhesive (PSA), etc.

As shown in FIG. 2, a light blocking unit 21 can also be disposed below the cover member 20 in an edge region including the non-active area (NA). In particular, the light blocking unit 21 prevents various circuits, wirings and structures disposed in the non-active area (NA) of the display panel 100 from being visible to users. That is, the light blocking unit 21 is disposed to correspond to at least the non-active area (NA) of the display panel 100 and includes a light absorbing material. The light blocking unit 21 can also be formed with a conductive material such as a black matrix, or by printing a conductive black ink.

In addition, FIG. 2 represents the display panel 100 including a front part (FP), a bending part (BND) and a pad part (PAD). As shown, the front part (FP) of the display panel 100 is disposed below the first connecting member 150 and is an area where images are displayed. In addition, the display panel 100 includes a display substrate 110, a pixel array unit 120, an encapsulation layer 130 and an optical plate 140.

Further, the bending part (BND) of the display panel 100 extends from a side of the front part (FP) and is bent in a bottom direction (−Z direction), and then bent again in a plane direction (Y direction). The display substrate 110 and the signal wiring can also be disposed in the bending part (BND).

In addition, the pad part (PAD) of the display panel 100 extends from the bending part (BND) and is disposed below the front part (FP). As shown in FIG. 2, the display substrate 110, signal wiring, and a pad electrode connected to the signal wiring are disposed in the pad part (PAD). A flexible printed circuit board 500 and a pixel driver 160 are also mounted in the pad part (PAD).

Further, the optical plate 140 is disposed in the front part (FP). A functional optical layer can also be disposed between the first connecting member 150 and the optical plate 140 to improve the display performance. The optical plate 140 can also improve outdoor visibility and a display image contrast ratio by preventing reflection of external light.

As shown in FIG. 2, the display substrate 110 is disposed on the bottom of the display panel 100. In particular, as shown, the display substrate 110 is disposed on the front part (FP), the bending part (BND), and the pad part (PAD). The display substrate 110 is also formed of a flexible plastic material including polyimide or a thin flexible glass material, for example.

As shown in FIG. 2, the pixel array unit 120 is disposed in the Active Area (AA) below the optical plate 140. Therefore, an area corresponding to the pixel array unit 120 can be the active area (AA) and a remaining area other than the active area (AA) can be the non-active area (NA).

Further, the pixel array unit 120 includes light emitting elements, driving thin film transistors to drive the light emitting elements, gate and data lines, and signal wiring such as a power line to drive the pixels. The pixel array unit 120 also includes pixels displaying images according to signals supplied to the signal wiring, and the pixels include the light emitting elements and the driving thin film transistors. The light emitting elements also include an anode electrode electrically connected with a corresponding driving thin film transistor, an emitter layer formed in the anode electrode, and a cathode electrode supplying a common voltage.

Further, a driving thin film transistor includes a gate electrode, a semiconductor layer, a source electrode, a drain voltage and the like. The semiconductor layer of the driving thin film transistor may include a silicone such as an a-Si, a poly-Si, a low temperature poly-Si and the like or an oxide such as Indium-Gallium-Zinc-Oxide (IGZO), but is not limited thereto.

Also, the anode electrode is disposed in each pixel area to correspond to an opening area a pixel pattern and is electrically connected with the corresponding driving thin film transistor. The light emitting elements also include an emitter layer formed between the anode electrode and the cathode electrode. In particular, the emitter layer is implemented to emit light in the same color such as a white-light per pixel, or in a different color such as a red, green, or blue per pixel.

Further, as shown in FIG. 2, an encapsulation layer 130 covers the pixel array unit 120 to prevent oxygen, moisture or other foreign material from penetrating into the light emitting element layer of the pixel array unit 120. The encapsulation layer 130 can also be a stacked-layer structure including alternately arranged organic and inorganic material layers.

In addition, the front part (FP) of the display panel 100 includes the display substrate 110, the pixel array unit 120 and the encapsulation layer 130, and is formed flat except at its edges. Thus, the first plate 210 is connected or bonded with the front part (FP) to maintain a flat state and improve rigidity. Further, the bending part (BND) of the display panel 100 includes the area where the pixel array unit 120, the encapsulation layer 130 and the first plate 210 are not disposed.

As shown in FIG. 2, the pad part (PAD) includes an area where the pixel array unit 120 and the encapsulation layer 130 are not disposed. The pad part (PAD) is also connected or coupled with a second plate 220 so as to maintain the flat state and improve rigidity. In other words, before the display panel 100 is bent, the first plate 210 disposed below the front part (FP) and the second plate 220 disposed at a lower portion of the pad part (PAD) are coupled at a lower portion of the display substrate 110 so as to reinforce a rigidity of the display substrate 110 and maintain the flat state of the front part (FP).

Further, the first plate 210 and the second plate 220 can also be formed to have a certain rigidity and thickness to reinforce the rigidity of the display substrate 110, and are not formed in an area of the bending part (BND). Before the display panel 100 is bent, the first plate 210 and the second plate 220 are disposed below the display substrate 110, and are spaced apart from each other.

In addition, after the display panel 100 is bent, and as shown in FIG. 2, the first plate 210 is disposed below the front part (FP) and the second plate 220 is disposed at an upper portion of the pad part (PAD). The first plate 210 and the second plate 220 are thus backplates disposed at a rear surface of the display substrate 110. The first plate 210 and the second plate 220 can also be formed of a thin film plastic having rigidity. For example, the first plate 210 and the second plate 220 can be formed of polyethyleneterephthalate (PET), polyimide (PI), polyethylene naphthalate (PEN), etc. The first plate 210 and the second plate 220 can also be formed of the same material having the same thickness, for example.

In addition, as shown in FIG. 2, the cushion plate 300 is disposed between the first plate 210 and the second plate 220. In particular, the cushion plate 300 can be formed of a plurality of layers or a single layer having cushioning and heat dissipation functions, for example.

That is, the cushion plate 300 can include one or more layers among the heat dissipation layer 310, a cushion layer 320 and an adhesive layer 330. For example, as shown in FIG. 2, the cushion plate 300 can include the adhesive layer 330, the cushion layer 320 and the heat dissipation layer 310 sequentially stacked in a bottom direction (−Z direction) from the top.

In addition, the heat dissipation layer 310 is disposed to correspond to a component generating high temperature, and includes a material having a high thermal conductivity. For example, heat generated in the driver 160 or the display panel 100 can be dissipated by the heat dissipation layer 310. Also, the heat dissipation layer 310 can include a metal having high thermal conductivity such as copper (Cu) and aluminum (Al), or graphite, for example. In addition, the heat dissipation layer 310 has a conductivity and accordingly can be grounded and protect a rear surface of the display substrate 110 along with dissipating heat.

Further, an anti-lifting layer can be additionally disposed between the heat dissipation layer 310 and the cushion layer 320. The anti-lifting layer can be formed of a flexible material such as a polyimide film, and be disposed to prevent the cushion plate 300 from being lifted when the sides of the cover member 20 are bent.

Further, as shown in FIG. 2, the cushion layer 320 is disposed on the heat dissipation layer 310, and can include a cushion material such as a foam tape or a foam pad, for example. The cushion layer 320 thus absorb shocks applied to various parts in contact with the cushion plate 300. The cushion layer 320 having the shock-absorbing function also reinforces the rigidity of the cushion plate 300.

In addition, as shown, the adhesive layer 330 is disposed on the cushion layer 320 and can include an uneven structure formed on a surface. In particular, the uneven structure of the adhesive layer 330 prevents the occurrence of air bubbles between the first plate 210 and the cushion plate 300 that may arise when the cushion plate 300 is attached to the first plate 210. Therefore, a process to remove the air bubbles existing between the first plate 210 and the cushion plate 300 can be omitted. Further, the adhesive layer 330 fixes the cushion plate 300 to the first plate 210.

Also, a second connecting member 400 and a second plate 220 are disposed between the cushion plate 300 and the pad part (PAD), or between the cushion plate 300 and the second plate 220. Further, the second connecting member 400 fixes the bent display panel 100 in a bent form because the second connecting member is connected to the bent display substrate 110 via the second plate 220. The second connecting member 400 also has a certain thickness so the curvature of the bending part (BND) can be maintained. In addition, the second connecting member 400 can be a double-sided adhesive tape fixing the second plate 220 and the heat dissipation layer 310. The second connecting member 400 includes an adhesive form tape or an adhesive foam pad, for example, thereby further improving a function of absorbing shocks.

In addition, the second plate 220 is disposed below the second connecting member 400. To fix the second plate 220 below the second connecting member 400, the second plate 220 can be connected or attached at a lower portion of the pad part (PAD) of the display panel 100, and the second plate 220 can be attached or fixed to the bottom of the second connecting member 400 by bending the bending part (BND).

When the second plate 220 is fixed to the second connecting member 400, the second plate 220 is disposed on the pad part (PAD). In other words, the second connecting member 400 and the second plate 220 are disposed between the heat dissipation layer 310 of the cushion plate 300 and the pad part (PAD).

In addition, an exterior top surface of the bending part (BND) is exposed to the outside with the second plate 220 fixed to the second connecting member 400. Also, a rear inside surface of the bending part (BND) faces sides the cushion plate 300 and the second connecting member 400.

As shown in FIG. 2, a reinforcing member 600 is disposed on the top exterior surface of the bending part (BND) of the display panel 100. In particular, the reinforcing member 600 covers the bending part (BND) and extends to cover at least a portion of the front part (FP) and the pad part (PAD).

In addition, the reinforcing member 600 may include resin such as UV curable acryl resin or thermoset resin. Various other materials can also be used as the reinforcing member 600. Further, the reinforcing member 600 can include a cured resin. For example, when using a UV curable resin, the resin can be cured using UV light irradiation. The reinforcing member 600 can also be a Micro Cover Layer (MCL), for example. In addition, the reinforcing member 600 also covers various signal wiring arranged between the encapsulation layer 130 and the pad part (PAD), thereby preventing the signal wiring from moisture penetration and protecting the signal wiring from external shocks.

As shown in FIG. 2, the bending part (BND) includes the flexible display substrate 110 without the other components. Thus, the reinforcing member 600 reinforces the rigidity of the bending part (BND). In addition, the bending part (BND) is disposed between the front part (FP) and the pad part (PAD), and is bent so that the front part (FP) and the pad part (PAD) are connected.

Also, as shown in FIG. 2, the pad part (PAD) is disposed below the front part (FP). In addition, because the second connecting member 400, the second plate 220, and the pad part (PAD) are disposed at a lower portion of the display panel where the bending part (BND) is disposed, the antistatic member 700 can be omitted in this region. That is, if the antistatic member 700 is preferably continuously disposed from a rear surface of the cover member 20 to the cushion plate. However, the bending part (BND) blocks the direct path between the cover member 20 and the cushion plate 300 such that the antistatic member 700 would be cut off and not continuously disposed. In addition, the lower end of the display panel 100 including the pad part (PAD) does not include the transistors for the display panel 100 so the application of the antistatic member 700 can be omitted.

Thus, the antistatic member 700 is formed along edges of the three sides of the cover member 20, but is not formed at the lower end of the display panel 100 where the pad part (PAD) is disposed. Accordingly, the connection path 350 and the groove portion 340 are disposed along the edges of the three sides where the pad part (PAD) is not disposed. That is, the connection path 350 and the groove portion 340 are disposed sequentially along the three sides of the cushion plate 300.

Further, in one embodiment, the connection path 350 is not formed at corners of the cushion plate 300. In more detail, the connection path 350 is formed by removing some areas of the adhesive layer 330, and thus a strength of the connection path 350 fixed to the first plate 210 may be weak. Therefore, by not forming the connection path 350 in corners, the heat dissipation layer 310 is fixed to the first plate 210 through the adhesive layer 330.

Figure 3:
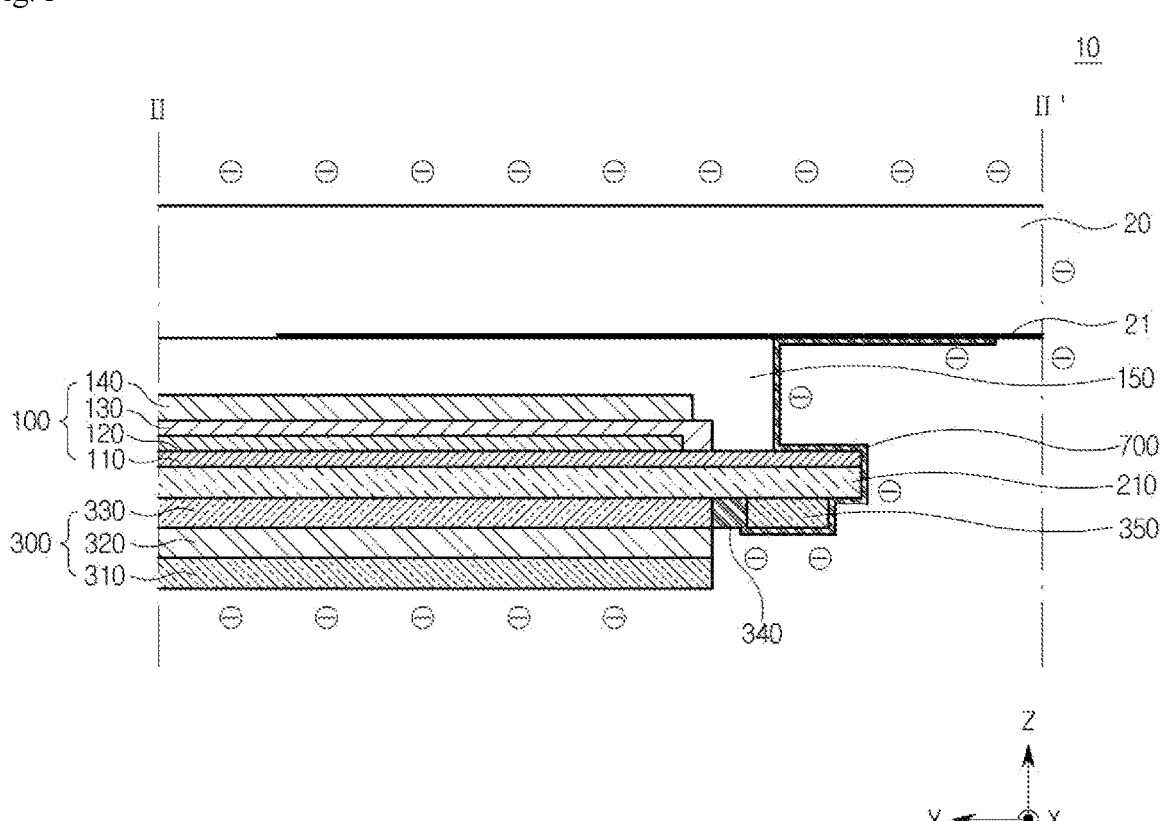
FIG. 3 is a sectional view taken along line II-II' of FIG. 1C.

Next, FIG. 3 is a sectional view taken along line II-II' of FIG. 1C. In particular, FIG. 3 illustrates the top, left and right sides of the display apparatus including the cover member 20, the display panel 100 and the cushion plate 300. As shown, the first connecting member 150 is disposed between the cover member 20 and the display panel 100, and the first plate 210 is disposed between the display panel 100 and the cushion plate 300.

In addition, as described above, an edge region of the cushion plate 300 corresponds to the non-active area (NA) of the display panel 100. Therefore, the groove portion 340 and the connection path 350 can be advantageously disposed to overlap with the non-active area (NA).

As shown, the groove portion 340 penetrates through the cushion plate 300 in a vertical direction towards the display panel 100. As described above, the cushion plate 300 can include one or more layers including the heat dissipation layer 310, the cushion layer 320, the adhesive layer 330 and the anti-lifting layer. Thus, in one embodiment, the groove portion 340 can penetrate all of the layers in the cushion plate 300, and in another embodiment, the groove portion 340 can penetrate two of the three layers in the cushion plate 300.

Further, as shown, the connection path 350 is formed by stacking the heat dissipation layer 310 in the penetrated area. In addition, as shown in FIG. 3, the groove portion 340 is an area where some portion of the heat dissipation layer 310, the cushion layer 320 and the adhesive layer 330 are removed. Further, the connection path 350 is disposed adjacent to the groove portion 340.

In addition, the groove portion 340 and the connection path 350 can be formed in various ways. For example, the groove portion 340 can be formed by removing some areas of the heat dissipation layer 310 and the cushion layer 320, or by removing some areas of the heat dissipation layer 310, the cushion layer 320 and the adhesive layer 330. The connection path 350 can be formed by removing some area of the cushion layer 320, or some areas of the cushion layer 320 and the adhesive layer 330, and stacking or disposing the heat dissipation layer 310 in the removed area.

That is, FIG. 3 illustrates one embodiment in which all three layers of cushion plate 300 are removed to form the groove portion 340 and the connection path 350. However, in another embodiment, only the heat dissipation layer 310 and cushion layer 320 can be removed and the groove portion 340 will have a depth equal to the thickness of the cushion layer 320 and the adhesive layer 330. The connection path 350 will have a similar thickness (i.e., a thickness corresponding to both the cushion layer 320 and the adhesive layer 330). Thus, in the alternative embodiment, the depth of the groove portion 340 will be greater allowing for more excess antistatic solution. In still another embodiment, the groove portion 340 could be formed by only removing portions of the heat dissipation layer 310. The connection path 350 would then correspond to the non-removed portion of heat dissipation layer 310.

As shown in the embodiment in FIG. 3, the bottom of the groove portion 340 is the first plate 210. If the groove portion 340 was disposed in the cushion layer 320 (e.g., by removing only the heat dissipation layer 320 and the cushion layer 320), the bottom of the groove portion 340 would be the adhesive layer 330. Similarly, if the groove portion 340 was disposed in the heat dissipation layer 310 (e.g., by only removing the heat dissipation layer 310), the bottom of the groove portion 340 would be the cushion layer 320. In addition, the side of the groove portion 340 includes one or more layers among the portions of the removed heat dissipation layer 310, the cushion layer 320, the adhesive layer 330 and the anti-lifting layer.

In addition, FIG. 3 illustrates a width of the connection path 350 is greater than a width of the groove portion 340. However, in an alternative embodiment, the width of the groove portion 340 can be larger than the width of the connection path 350. A larger width of the groove portion 340 advantageously allows for more antistatic member 700 to fill into the groove portion 340 and thus prevents over-filled antistatic member 700 from reaching or spilling onto the side or bottom surfaces of the cushion layer 300, etc.

Figure 4:
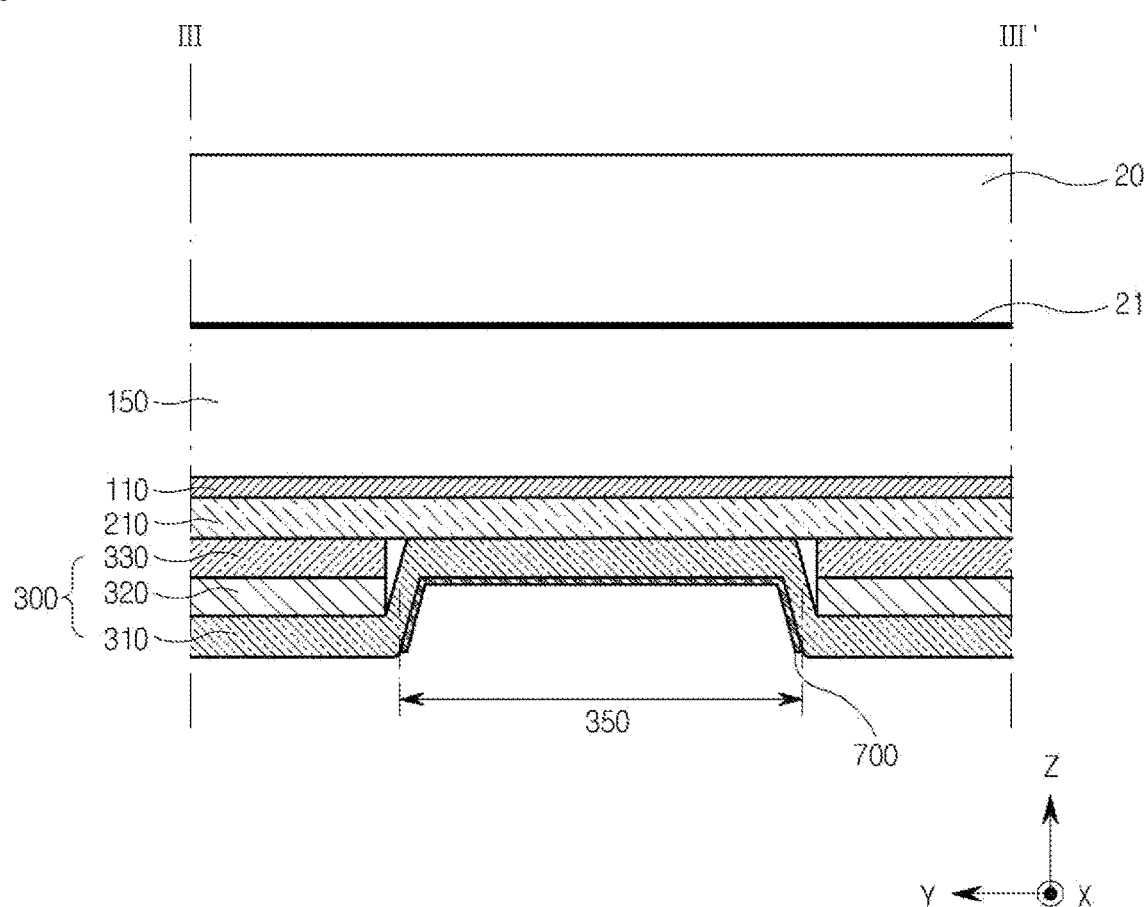
FIG. 4 is a sectional view taken along line III-III' of FIG. 1C.

Next, FIG. 4 is a sectional view taken along line III-III' of FIG. 1C. In particular, FIG. 4 is a diagram illustrating a sectional view of the connection path 350 of the cushion plate 300. As shown, the connection path 350 is formed by stacking the heat dissipation layer 310 in an area where one or more layers among the cushion layer 320, the adhesive layer 330 and the anti-lifting layer are removed. In addition, a bottom and sides of the connection path 350 correspond to the heat dissipation layer 310.

As shown in FIG. 4, the connection path 350 is a groove path guiding the antistatic solution flow from the first plate 210 to the groove portion 340 and is formed to be lower than the other areas of the cushion plate 300. In addition, the connection path 350 transfers the electric charge and electric field of the cover member 20 to the heat dissipation layer 310.

As described above, the groove portion 340 and the connection path 350 can be formed by removing layers of the cushion plate 300, thereby simplifying the manufacturing process. For example, in an area where the groove portion 340 and the connection path 350 are located and overlapped, the groove portion 340 and the connection path 350 can be formed by removing one or more layers among the cushion layer 320, the adhesive layer 330 and the anti-lifting layer and forming the heat dissipation layer 310 in the remaining area except the groove portion 340.

Figure 5A:
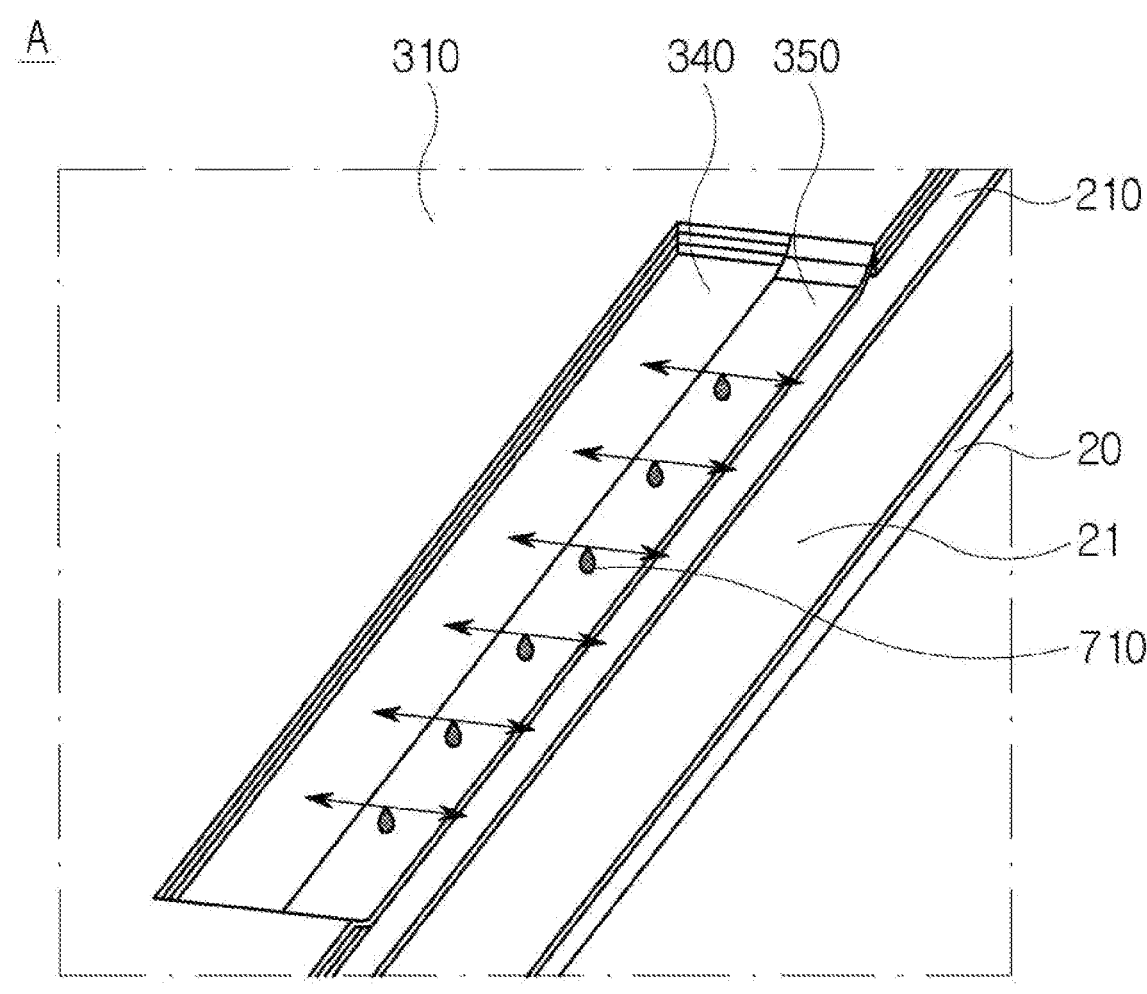
FIG. 5A is an enlarged plan view of the area "A" of FIG. 1C.

Next, FIG. 5A is an enlarged plan view of the area "A" of FIG. 1C. Referring to FIG. 5A, the groove portion 340 and the connection path 350 are formed by removing one or more layers among the cushion layer 320, the adhesive layer 330 and the anti-lifting layer and forming the heat dissipation layer 310 in the remaining area except the groove portion 340. Further, the grooves of the connection path 350 are formed to be connected with the groove portion 340.

Depending on an application amount of the antistatic solution 710, a length of the groove portion 340 and the connection path 350 can be adjusted. If the application amount of the antistatic solution 710 is large, a larger amount of the antistatic solution 710 can be filled by increasing a length of the groove portion 340 and a length of the connection path 350.

In addition, the groove portion 340 is disposed closer to the active area (AA) of the display panel 100, and thus increasing the length of the groove portion 340 can deteriorate the heat dissipation and shock absorption performance in the active area (AA). Therefore, by forming the connection path 350 longer than the groove portion 340, the heat dissipation and shock absorption performance can be maintained and the antistatic solution 710 can efficiently prevented from flowing towards areas other than the groove portion 340.

In addition, with the longer connection path 350, the distribution of the electric charge transferred from the cover member 20 improves. For example, because the connection path 350 is disposed along the upper, left and right sides of the cushion plate 300 and is not disposed on the lower end where the pad part (PAD) is positioned, the mobility of the electric charge is improved. That is, the connection path 350 can be disposed entirely along the upper, left, and right side of the cushion plate 300.

In addition, the antistatic member 700 can be formed with an antistatic coating process including the application of the antistatic solution 710 to sides of the display apparatus 10. The antistatic solution 710 includes electric conductivity materials to help transfer the electric charge from the cover member 20 to the heat dissipation layer 310 or the connection path 350. Therefore, the antistatic solution 710 includes an electrically conductive material such as a conductive polymer compound, for example. The conductive polymer compound can be poly(3,4-ethylenedioxythiophene) polystyrene sulfonate (PEDOT:PSS), for example.

Further, a thickness of the antistatic member 700 can be 1 μm to 10 μm. When the thickness of the antistatic member 700 is 1 μm or less, the electrical conductivity of the conductive compound noticeably declines causing less discharge of the electric charge by the antistatic member 700. If the thickness of the antistatic member 700 is 10 μm or more, the adhesion of a ground tape declines because of the larger thickness of the antistatic member 700.

In addition, the conductive material included in the antistatic solution 710 includes, for example, molybdenum (Mo), chrome (Cr), titanium (Ti), neodymium (Nd), copper (Cu), and an alloy of silver (Ag) and magnesium (Mg). As shown, the antistatic solution 710 can be applied sequentially along the three sides (upper, left, and right sides) of the display apparatus 10. In particular, the antistatic solution 710 can be applied on the first plate 210 so that the antistatic solution 710 flows from the cover member 20 to the connection path 350.

In more detail, referring to FIG. 3, the first plate 210 protrudes further than the connection path 350, and thus the antistatic solution 710 can be applied on the protruding first plate 210. The applied antistatic solution 710 then flows towards the connection path 350 and is formed from the cover member 20 to the connection path 350.

When the display apparatus 10 is placed upside down and the cover member 20 is positioned towards the bottom, the applied antistatic solution 710 flows to the connection path 350 and the cover member 20 because of the application pressure and gravity. The antistatic solution 710 can also be applied on the connection path 350 to form the antistatic member 700. As the antistatic solution 710 flowing to the groove portion 340 is reduced and the antistatic solution 710 flowing by gravity to the cover member 20 is increased, the application pressure is reduced compared to when the solution is applied on the first plate 210.

In addition, the antistatic solution 710 flowing over the connection path 350 can fill in the groove portion 340, and sides of the groove portion 340 can be formed higher so that the antistatic solution 710 does not overflow. Therefore, the groove portion 340 includes a boundary in which the antistatic member 700 is applied. Further, as shown in FIG. 3, for example, the antistatic member 700 does not extend beyond the groove portion 340.

In more detail, the antistatic member 700 continuously extends on a side of the cover member 20, a side of the display panel 100, a side of the cushion plate 300, the connection path 350 and the groove portion 340. The cured antistatic member 700 thus covers the sides of the components. For example, the antistatic member 700 is formed on a side of the first connecting member 150 and on a side of the first plate 210. If the light blocking unit 21 is also included, the antistatic member 700 is also formed on the light blocking unit 21 disposed on the cover member 20.

Hereinafter, a method for manufacturing the cushion plate 300 including the groove portion 340 and the connection path 350 will be described. In particular, the cushion plate 300 can be formed by stacking the heat dissipation layer 310, the cushion layer 320 and the adhesive layer 330.

In more detail, the cushion plate 300 can be formed by stacking the heat dissipation layer 310 on the cushion layer 320 and the adhesive layer 330 from which the groove portion 340 and the connection path 350 are removed, punching (penetrating or removing) the groove portion 340 with a punching apparatus or a trimming apparatus and bending a part where the connection path 350 positions in the heat dissipation layer 310.

Alternatively, the cushion plate 300 can be formed by stacking the heat dissipation layer 310 on the cushion layer 320 and the adhesive layer 330 from which the connection path 350 is removed, punching (penetrating or removing) the groove portion 340 with a punching apparatus or a trimming apparatus and bending a part where the connection path 350 positions in the heat dissipation layer 310. The cushion plate 300 where the groove portion 340 and the connection path 350 are formed can be stacked (attached or fixed) on the first plate 210.

Figure 5B:
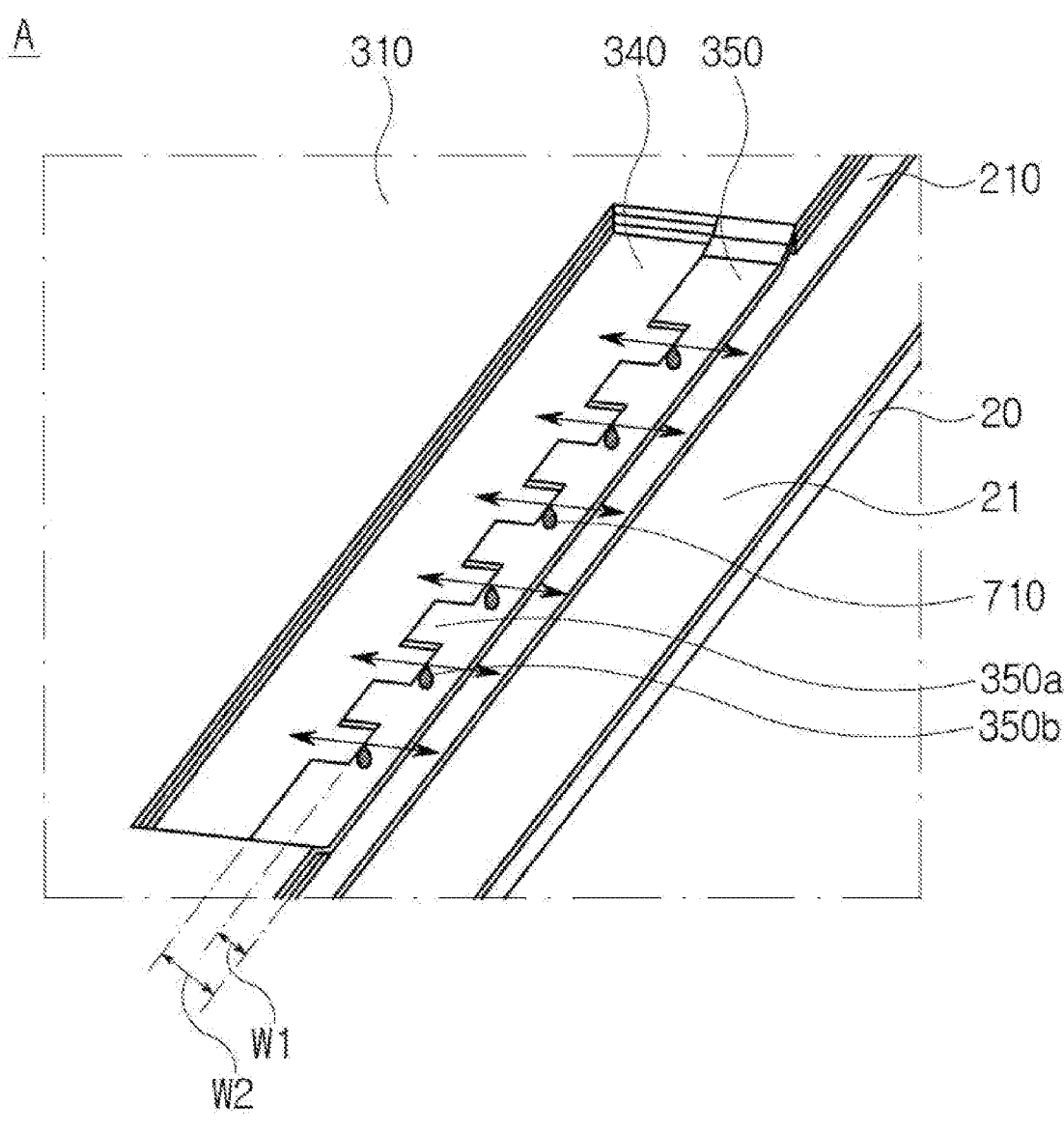
FIG. 5B is an enlarged perspective view illustrating a connection path according to another embodiment of the present disclosure.

Next, FIG. 5B is an enlarged view of the area "A" of FIG. 1C and illustrates a connection path 350 according to another embodiment of the present disclosure. As shown in FIG. 5B, the connection path 350 can be formed in a sawtooth or horseshoe shape on a plane (when viewed from the Z-axis). That is, the connection path 350 can include protrusions 350a protruding from a base portion 350b of the connection path 350. For example, the protrusions 350a can be formed by cutting out portions of the connection path 350, so the connection path 350 is formed in a sawtooth or horseshoe shape having a base portion 350b and a protruding portion 350a.

As the original width (W2) of the connection path 350 becomes narrower, a size of the groove portion 340 is increased. Thus, the capacity of the groove portion 340 to store the antistatic solution 710 also increases, thereby preventing the overflowing antistatic solution 710 into other areas. Therefore, the connection path 350 can have a narrower width (W1) that is a cutout portion, for example, from the original width (W2) of the connection path 350.

In addition, as the width of the connection path 350 becomes narrower, the strength with which the connection path 350 is fixed or attached weakens, and the connection path 350 may be lifted off the first plate 210. Therefore, one embodiment of the present invention forms the connection path 350 to have the protrusions 350a to fix the connection path 350 more securely to the first plate 210. Thus, the protrusions 350a protruding from the base portions 350b of the connection path 350, both increase the size of the groove portion 340 and also help fix the connection path 350 more securely to the first plate 210.

Figure 5C:
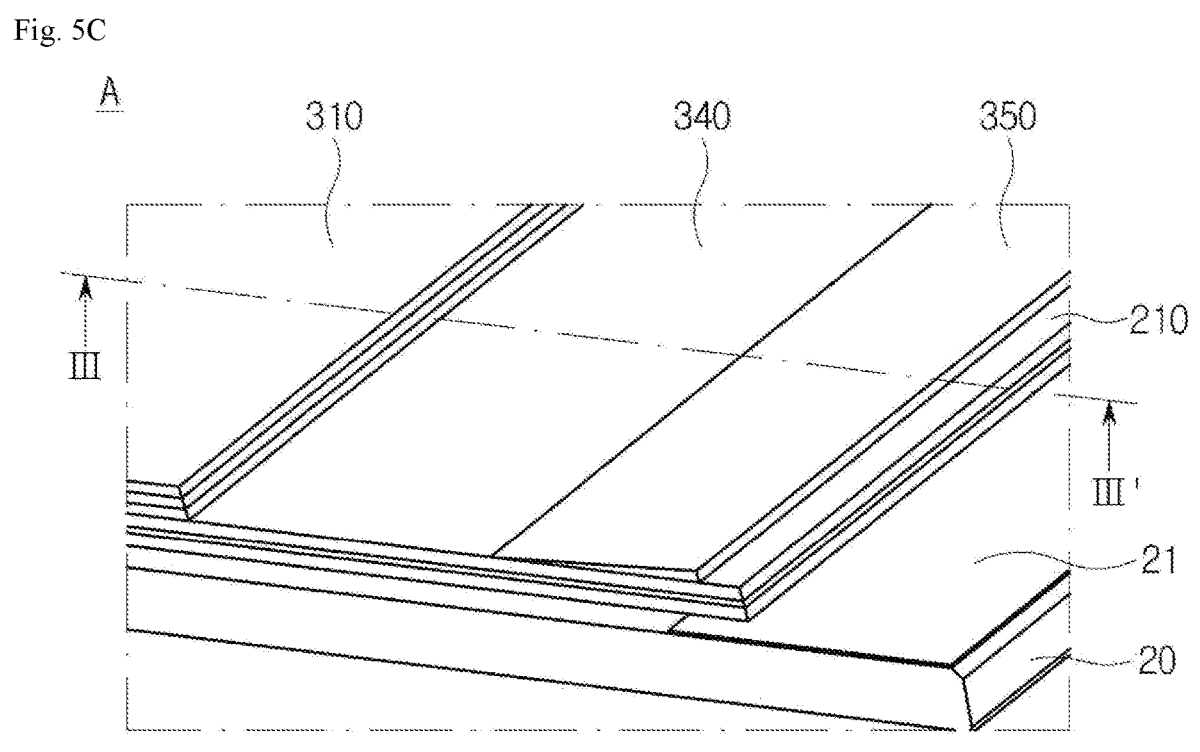
Figure 5D:
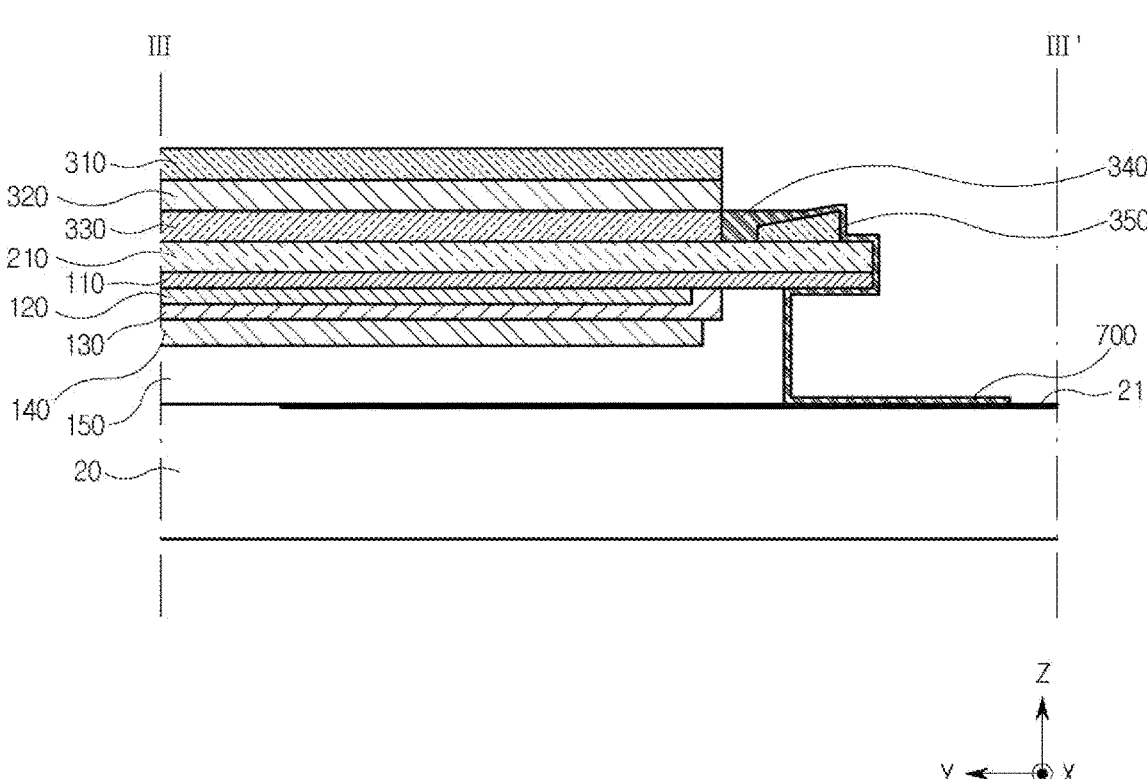
FIG. 5D is a sectional view taken along line III-III' of FIG. 5D.

Next, FIG. 5C is an enlarged perspective view illustrating a connection path 350 according to another embodiment of the present disclosure, and FIG. 5D is a sectional view taken along line III-III' of FIG. 5C. As shown, the connection path 350 can also be formed to have a sectional taper form (when viewed from the Y-axis). That is, the connection path 350 can decline in thickness towards a center portion of the display apparatus 10.

Thus, the tapered connection path 350 has a greater surface area to accommodate the application of the antistatic solution 710, thereby helping to prevent overflowing of the antistatic solution 710 into other areas. Further, the larger amount of the antistatic solution 710 on the tapered connection path 350, the larger amount of mobility of the electric charge transferred from the cover member 20 to the connection path 350.

The present invention encompasses various modifications to each of the examples and embodiments discussed herein. According to the invention, one or more features described above in one embodiment or example can be equally applied to another embodiment or example described above. The features of one or more embodiments or examples described above can be combined into each of the embodiments or examples described above. Any full or partial combination of one or more embodiment or examples of the invention is also part of the invention.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A display apparatus comprising:
a display panel;
a protective cover member disposed on the display panel;
a first plate disposed below the display panel;
a cushion plate disposed below the first plate;
a connection path formed below the first plate and spaced a predetermined distance from the cushion plate to form a groove portion between the connection path and the cushion plate; and
an antistatic member disposed on a rear surface of the cover member, extending on sides of the display panel and the first plate, and extending on a side and a bottom of the connection path to the groove portion and configured to transfer electrostatic charges from the cover member to the cushion plate.

2. The display apparatus of claim 1, wherein the cushion plate comprises:
a heat dissipation layer;
a cushion layer disposed on the heat dissipation layer; and
an adhesive layer disposed on the cushion layer and configured to fix the cushion plate to the first plate, and
wherein the connection path includes a same heat dissipating material as the heat dissipation layer.

3. The display apparatus of claim 2, wherein the groove portion has a depth equal to a thickness of the adhesive layer, and
wherein the connection path has a thickness equal to the depth of the groove portion.

4. The display apparatus of claim 2, wherein the groove portion has a depth equal to a thickness of both the adhesive layer and the cushion layer, and
wherein the connection path has a thickness equal to the depth of the groove portion.

5. The display apparatus of claim 2, wherein the antistatic member is further disposed in the groove portion formed in the space between the adhesive layer and the connection path.

6. The display apparatus of claim 2, wherein the adhesive layer, the groove portion and the connection path have a same thickness.

7. The display apparatus of claim 1, further comprising:
a connecting member disposed on the display panel and below the cover member,
wherein the antistatic member is further disposed on a side of the connecting member.

8. The display apparatus of claim 7, wherein the display panel comprises:

a display substrate;

a pixel array unit disposed on the display substrate;

an encapsulating layer encapsulating the pixel array unit; and an optical plate disposed on the encapsulating layer.

9. The display apparatus of claim 8, wherein the antistatic member is further disposed on a side of the display substrate.

10. The display apparatus of claim 8, wherein the display substrate and the first plate protrude outwards relative the connecting member and the cushion plate.

11. The display apparatus of claim 10, wherein the antistatic member is further disposed on sides of the protruding display substrate and the protruding first plate.

12. The display apparatus of claim 10, wherein the protruding display substrate and the protruding first plate protrude a predetermined distance from the connection path.

13. The display apparatus of claim 8, wherein the antistatic member is continuously disposed on the rear surface of the cover member, a side of the connecting member, a top surface and a side surface of the display substrate, the side and a bottom of the first plate, and the side and the bottom of the connection path.

14. The display apparatus of claim 1, wherein the connection path has a tapered shape tapering towards the cushion plate.

15. The display apparatus of claim 14, wherein the tapered connection path guides excess antistatic solution into the groove portion.

16. The display apparatus of claim 1, further comprising:

a pad part disposed on a lower end of the display apparatus and including a display driver and a flexible printed circuit board for driving the display panel, wherein the connection path and the groove portion are disposed on a top end, left side and right side of the display apparatus without being disposed on the lower end of the display apparatus.

17. The display apparatus of claim 1, wherein the antistatic member comprises a cured antistatic solution including a conductive material.

18. The display apparatus of claim 1, wherein the antistatic member is electrically connected with a ground through a ground path to discharge the electrostatic charge of the cover member to the outside.

19. The display apparatus of claim 1, wherein the antistatic member is continuously disposed to connect the cover member to a heat dissipation layer in the cushion plate to transfer the electrostatic charges from the cover member to the heat dissipation layer.

20. The display apparatus of claim 1, wherein a width of the groove portion is greater than a width of the connection path.

* * * * *